(12) United States Patent  
Li et al.

(10) Patent No.: US 11,784,427 B2  
(45) Date of Patent: Oct. 10, 2023

(54) SOCKET ACTUATION MECHANISM FOR PACKAGE INSERTION AND PACKAGE-SOCKET ALIGNMENT

(71) Applicant: ADVANCED MICRO DEVICES, INC., Santa Clara, CA (US)

(72) Inventors: Peng Li, Santa Clara, CA (US); Changwei Liang, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/487,929

(22) Filed: Sep. 28, 2021

(65) Prior Publication Data

US 2023/0100491 A1    Mar. 30, 2023

(51) Int. Cl.
*H01R 12/88*        (2011.01)

(52) U.S. Cl.
CPC .................................... *H01R 12/88* (2013.01)

(58) Field of Classification Search
CPC ........ H01R 12/88; H01R 12/89; H01R 12/91; H01R 12/85
USPC ............................................................ 439/68
See application file for complete search history.

(56) References Cited

U.S. PATENT DOCUMENTS

| | | | | |
|---|---|---|---|---|
| 6,957,973 B1* | 10/2005 | McHugh | ................ | H01R 12/88 439/73 |
| 7,207,822 B2* | 4/2007 | Szu | ...................... | H05K 7/1061 439/342 |
| 8,506,316 B2* | 8/2013 | Tsai | ...................... | H05K 7/1061 439/331 |
| 8,979,565 B2* | 3/2015 | Yeh | ......................... | H01R 12/88 439/331 |
| 8,979,566 B2* | 3/2015 | Yeh | ......................... | H01R 12/88 439/331 |
| 9,192,070 B2* | 11/2015 | Tan | ......................... | H05K 7/10 |
| 9,466,900 B1* | 10/2016 | Heng | ..................... | H01R 12/88 |
| 9,949,396 B2* | 4/2018 | Zhang | ..................... | G06F 1/183 |
| 9,960,513 B1* | 5/2018 | Peng | ..................... | H05K 7/1007 |
| 11,411,332 B2* | 8/2022 | Cheng | .................. | H01R 13/436 |
| 2013/0322037 A1* | 12/2013 | Tan | ......................... | H05K 13/00 361/752 |
| 2018/0159253 A1 | 6/2018 | Liao | | |
| 2019/0313543 A1 | 10/2019 | Su | | |
| 2021/0126389 A1 | 4/2021 | Cheng | | |

FOREIGN PATENT DOCUMENTS

CN        202633658 U       12/2012
CN        205452718 U        8/2016

OTHER PUBLICATIONS

International Search Report and Written Opinion, PCT/US2022/039580, dated Oct. 28, 2022, 12 pages.

* cited by examiner

*Primary Examiner* — Harshad C Patel

(57) ABSTRACT

A socket actuation mechanism for package insertion and package-socket alignment, including: a socket frame comprising a plurality of first hinge portions; a carrier frame comprising: a center portion comprising one or more package interlocks; and a tab extending from a first end of the carrier frame, the tab comprising a second hinge portion couplable with the plurality of first hinge portions to form a hinge coupling the carrier frame to the socket frame.

20 Claims, 17 Drawing Sheets

SOCKET ACTUATION MECHANISM FOR PACKAGE INSERTION AND PACKAGE-SOCKET ALIGNMENT

BACKGROUND

A central processing unit (CPU) socket provides electrical and mechanical connections between a die package (e.g., a CPU) and a printed circuit board (PCB). In some implementations, the electrical and mechanical connections between the die package and the CPU are formed by pins inserted into holes or making connections formed by contacts mating with pads. Due to their small size, the pins are susceptible to damage or breakage when the die package is being seated into the socket. In order to ensure proper alignment between the die package and the socket and to reduce the likelihood of damage during seating, a socket actuation mechanism (SAM) is used to seat a die package in the socket.

DETAILED DESCRIPTION

Figure 1A:
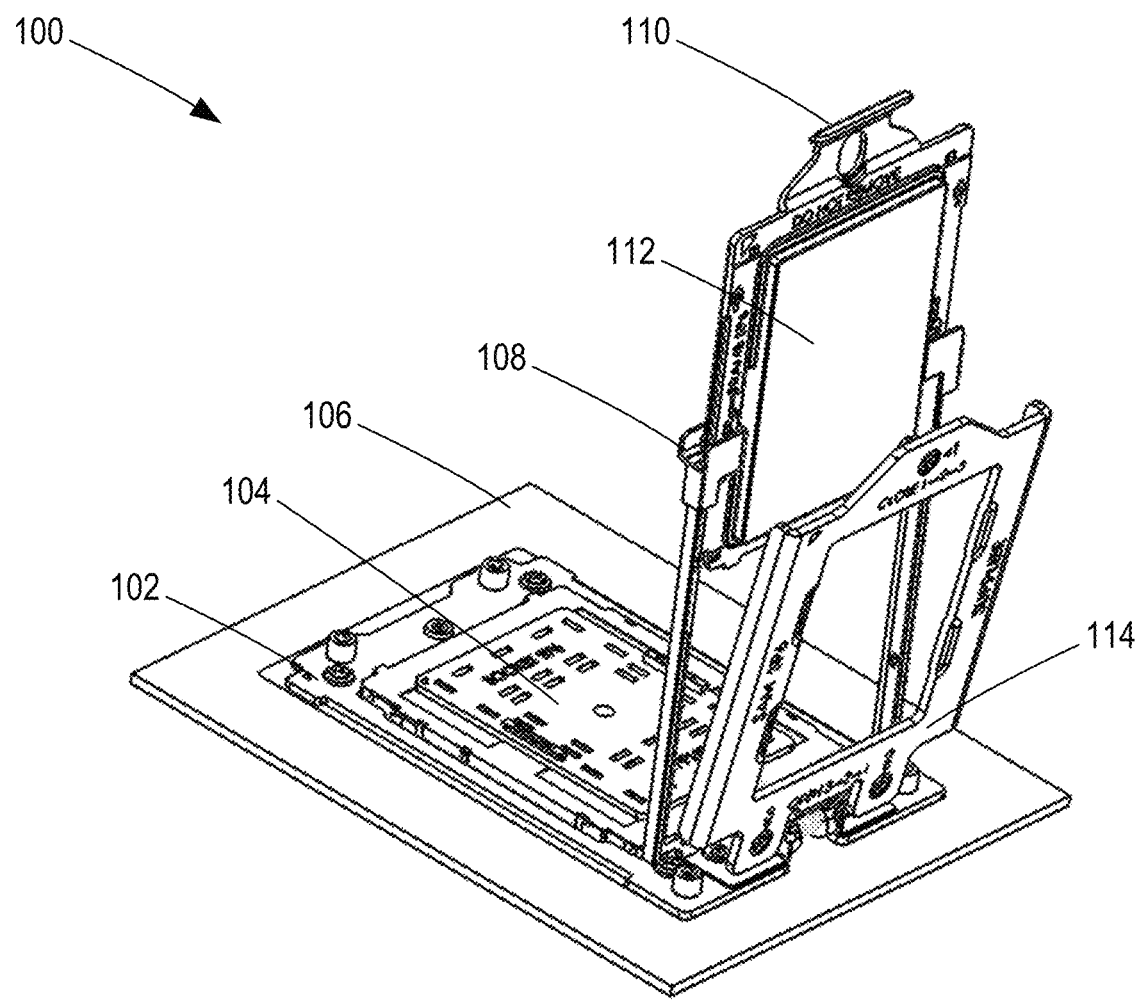
FIG. 1A is a diagram of an example socket actuation mechanism.

A central processing unit (CPU) socket provides electrical and mechanical connections between a die package (e.g., a CPU) and a printed circuit board (PCB). In some implementations, the electrical and mechanical connections between the die package and the CPU are formed by pins inserted into holes or making connections formed by contacts mating with pads. For example, in a land grid array (LGA) socket, the pins are mounted on the socket. As another example, in a pin grid array (PGA) socket, the pins are mounted on the die package and inserted into holes in the socket.

Due to their small size, the pins are susceptible to damage or breakage when the die package is being seated into the socket. In order to ensure proper alignment between the die package and the socket and to reduce the likelihood of damage during seating, a socket actuation mechanism (SAM) is used to seat a die package in the socket. A die package is placed in the SAM. When the SAM is actuated, the die package is seated into the socket. The presence of the SAM occupies space on the PCB and volume in a case or chassis holding the PCB, thereby taking space away that would be otherwise available for other resources. Accordingly, it is advantageous to reduce the horizontal and vertical footprint of the SAM in order to reduce the overall space and volume consumed on the PCB.

To that end variations of socket actuation mechanisms are disclosed. In an implementation, a socket actuation mechanism for package insertion and package-socket alignment includes: a socket frame including a plurality of first hinge portions; a carrier frame. The carrier frame includes a center portion including one or more package interlocks and a tab extending from a first end of the carrier frame. The tab includes a second hinge portion couplable with the plurality of first hinge portions to form a hinge coupling the carrier frame to the socket frame.

In some implementations, the carrier frame, when coupled to the socket frame via the hinge, is rotatable to align the center portion of the carrier frame with another center portion of the socket frame. In some implementations, each first hinge portion includes a rotational socket and a guide gap extending from the rotational socket and having a width less than a circumference of the rotational socket. In some implementations, the second hinge portion includes a plurality of guide tabs each having a first dimension substantially similar to the circumference of the rotational socket and a second dimension substantially similar to the width of the guide gap. In some implementations, the socket actuation mechanism further includes a force frame coupled to the socket frame by another hinge. In some implementations, the other hinge includes a spring-loaded hinge. In some implementations, the socket frame further includes one or more screw holes and the force frame includes one or more holes aligned with the one or more screw holes when the force frame is actuated. In some implementations, the carrier frame further includes another tab extending from a second end of the carrier frame.

In some implementations, an apparatus for package insertion and package-socket alignment includes: a substrate including a central processing unit (CPU) socket; a socket actuation mechanism including: a socket frame framing the CPU socket, the socket frame including a plurality of first hinge portions; a carrier frame a tab extending from a first end of the carrier frame, the tab including a second hinge portion coupled to the plurality of first hinge portions to form a hinge; and a die package coupled to the carrier frame and seated in the CPU socket.

In some implementations, the die package is framed by the socket frame within a center portion of the socket frame. In some implementations, each first hinge portion includes a rotational socket and a guide gap extending from the rotational socket and having a width less than a circumference of the rotational socket. In some implementations, the second hinge portion includes a plurality of guide tabs each having a first dimension substantially similar to the circumference of the rotational socket and a second dimension substantially similar to the width of the guide gap. In some implementations. the socket actuation mechanism further includes a force frame coupled to the socket frame by another hinge. In some implementations, the force frame is fixed in an actuated position by one or more screws. In some implementations, the carrier frame further incudes another tab extending from a second end of the carrier frame.

In some implementations, a method for package insertion and package-socket alignment includes: inserting, into a plurality of first hinge portions of a socket frame, a second hinge portion of a carrier frame by aligning each guide tab of a plurality of guide tabs of the second hinge portion with a guide gap of a corresponding first hinge portion, wherein the carrier frame is coupled to a die package framed in a center portion of the carrier frame; rotating the carrier frame around an axis of a hinge formed by the plurality of first hinge portions of the second hinge portions; and seating the die package in a CPU socket framed by the socket frame.

In some implementations, the method further includes actuating a force frame coupled to the socket frame by another hinge. In some implementations, the method further includes fixing the force frame in an actuated position. In some implementations, the force frame, when actuated, applies a force to the die package into the CPU socket. In some implementations, a dimension of each guide tab is substantially similar to a width of the guide gap.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes implementations in which the first and second features are formed in direct contact and includes implementations in which additional features are formed between the first and second features, such that the first and second features are not in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to easily identify various components and identify that those components are, for example, on opposing sides of another component. The spatially relative terms are intended to encompass different orientations of the device in use or operation in addition to the orientation depicted in the figures.

Figure 1B:
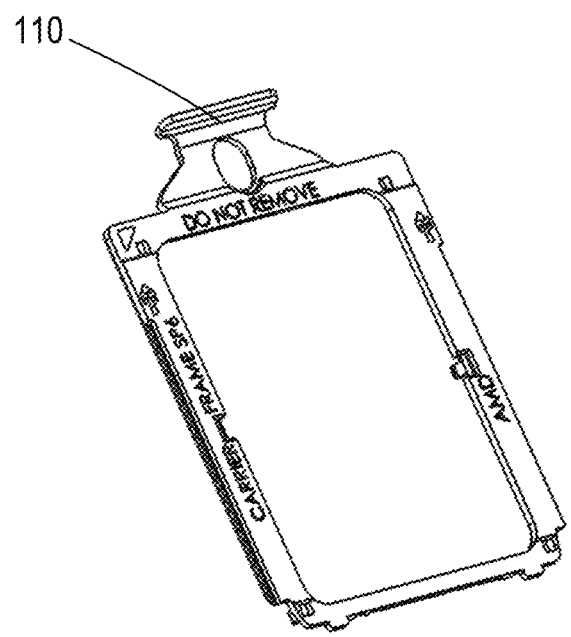
FIG. 1B is a diagram of an example carrier frame for the example socket actuation mechanism of FIG. 1A.
Figure 2A:
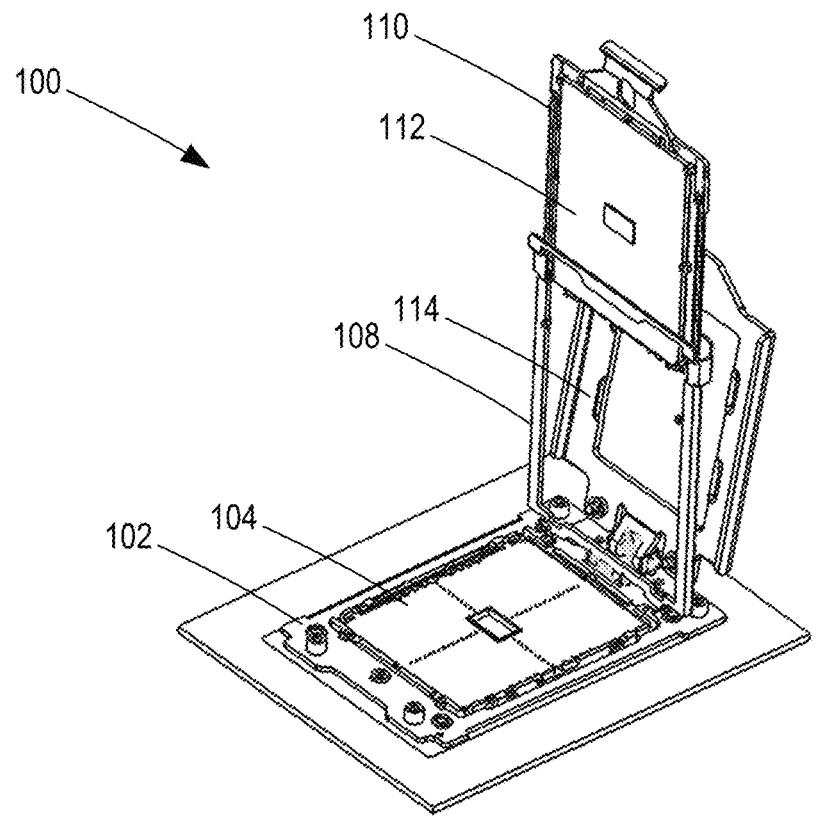
FIG. 2A is a portion of a process flow for seating a die package using the example socket actuation mechanism of FIG. 1A.
Figure 2B:
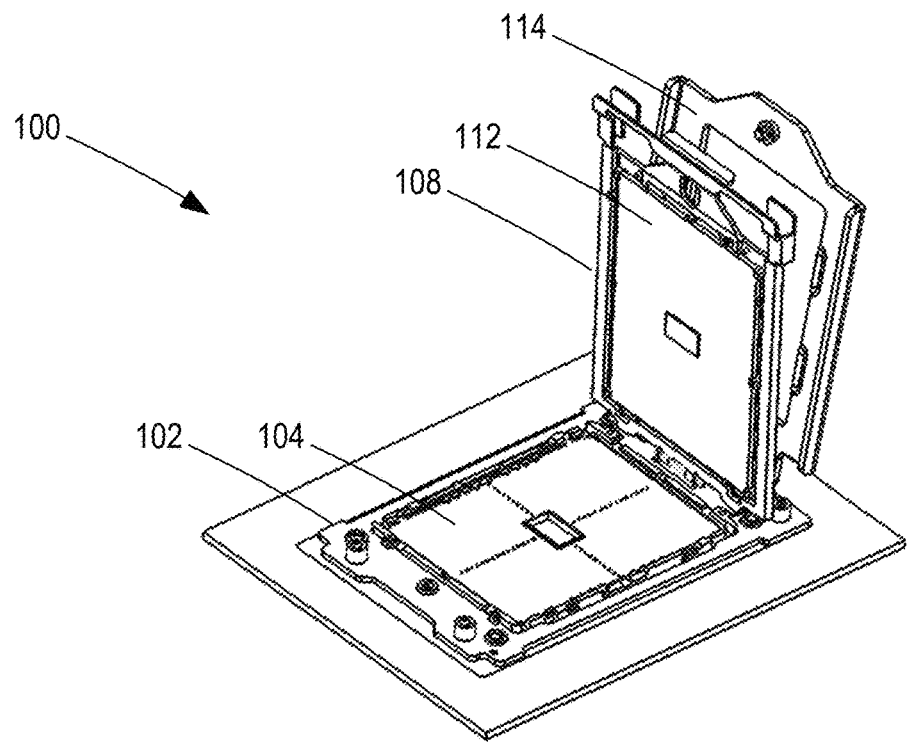
FIG. 2B is a portion of a process flow for seating a die package using the example socket actuation mechanism of FIG. 1A.

FIG. 1A shows an existing implementation of a SAM 100. The SAM includes a socket frame 102 with a center portion framing a socket 104. The socket frame 102 and socket 104 are mounted on or coupled with a substrate 106 such as a PCB. A rail frame 108 is coupled to the socket frame 102 using a hinge or other mechanism that allows the rail frame 108 to rotate towards the socket frame 102 and socket 104. The rail frame 108 is open at one end to allow a carrier frame 110 to be inserted into the rail frame 108 as shown in FIGS. 2A and 2B. The rail frame 108 includes internal rails to restrict movement of the carrier frame 110 when inserted. The carrier frame 110 includes a center portion that frames a die package 112. The die package 112 is held in place within the carrier frame 110 by one or more interlocks, such as clips, tabs, or other components. When a rail frame 108 holding a carrier frame 110 is rotated towards the socket frame 102 and socket 104, the carrier frame 110 and rail frame 108 maintain the alignment of the die package 112 connections with the socket 104. Thus, when the rail frame 108 is rotated to be substantially parallel to the socket 104 the die package 112 will be seated within the socket 104. A view of the carrier frame 110 separated from the SAM 100 is shown at FIG. 1B.

Figure 1C:
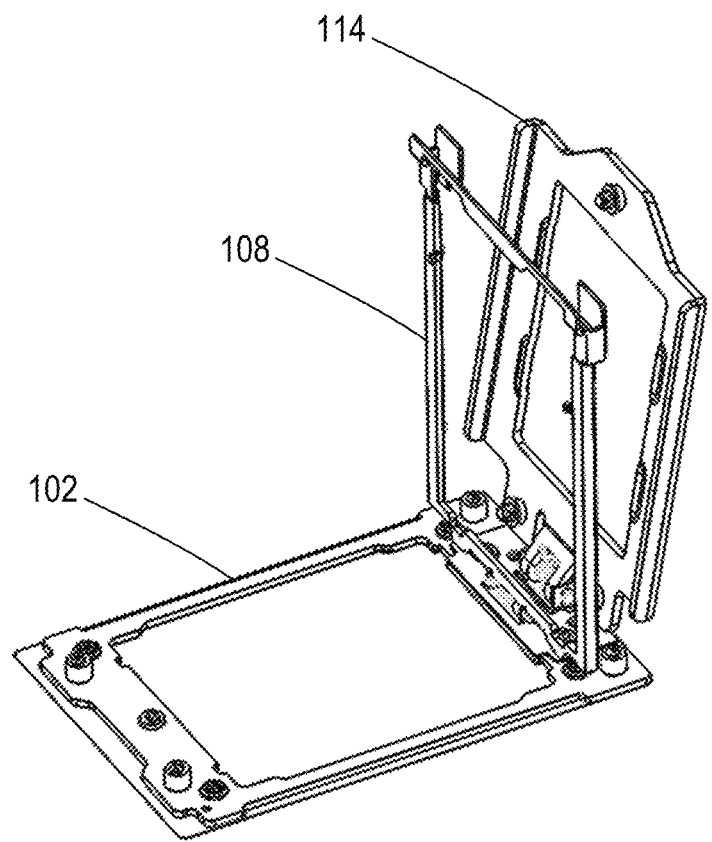
FIG. 1C is a diagram of an example force frame, rail frame, and socket frame of the example socket actuation mechanism of FIG. 1A.
Figure 2C:
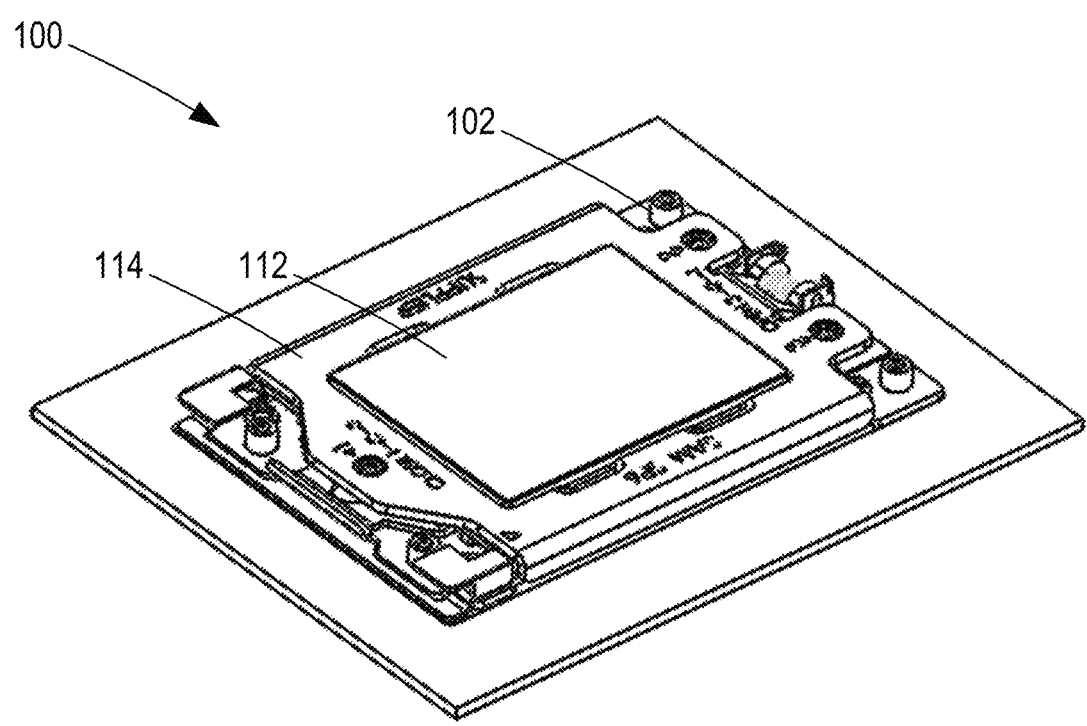
FIG. 2C is a portion of a process flow for seating a die package using the example socket actuation mechanism of FIG. 1A.

The SAM 100 also includes a force frame 114. The force frame 114 is also coupled to the socket frame 102 using a hinge or mechanism that allows the force frame 114 to rotate towards the socket frame 102 and socket 104. For example, the force frame 114 is coupled to the socket frame 102 using a spring loaded hinge. A view of the socket frame 102 and force frame 114 separated from the carrier frame 110 is shown at FIG. 1C. The force frame 114, after insertion as shown in FIGS. 2A and 2B, is actuated by rotating towards the socket frame 102 and socket 104 such that the force frame 114 contacts the carrier frame 110 or the rail frame 108 when the die package 112 is seated in the socket 104. Thus, the force frame 114, when actuated, provides a force to the die package 112 into the socket 104 (e.g., indirectly by contact with the frame 110 or rail frame 108). In some implementations, the force frame 114 is fixed in an actuated positions using screws or other locking mechanisms, thereby fixing or locking the die package 112 in a seated position within the socket 104 as shown in FIG. 2C.

Figure 3A:
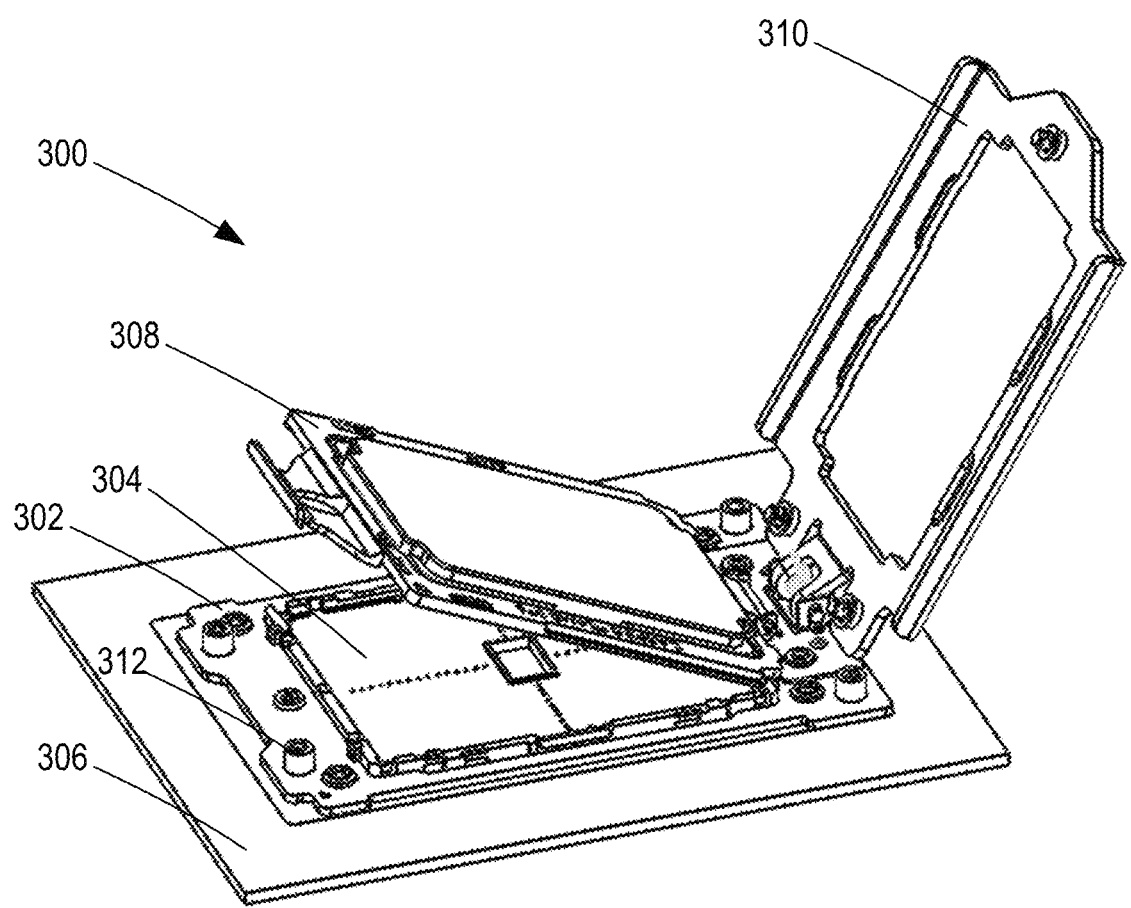
FIG. 3A is a diagram of an example socket actuation mechanism for package insertion and package-socket alignment according to some implementations of the present disclosure.

Though the SAM 100 allows for a die package 112 to be seated in the socket 104, the use of the rail frame 108 adds to the horizontal and vertical footprint of space taken up by the SAM 100. A reduction in the horizontal or vertical footprint of the SAM 100 would allow for other functional components to be used on the PCB or die package 112. To address these concerns, shown in FIG. 3A is an example SAM 300 for package insertion and package-socket alignment according to some implementations of the present disclosure. The example SAM 300 can be implemented in a variety of computing devices, including mobile devices, personal computers, peripheral hardware components, gaming devices, set-top boxes, and the like.

The SAM 300 includes a socket frame 302. The socket frame 302 is a frame of rigid material such as metal or plastic. The socket frame 302 includes an open center portion. The socket frame 302, when mounted on a substrate 306 such as a PCB, frames a socket 304 with the open center portion. The socket 304 includes any CPU socket as can be appreciated by one skilled in the art, including an LGA socket, a PGA socket, and the like. The socket frame 302 is mounted to the substrate 306 using screws or other interlocking mechanisms as can be appreciated so as to fix the socket frame 302 in place around the socket 304.

Figure 3B:
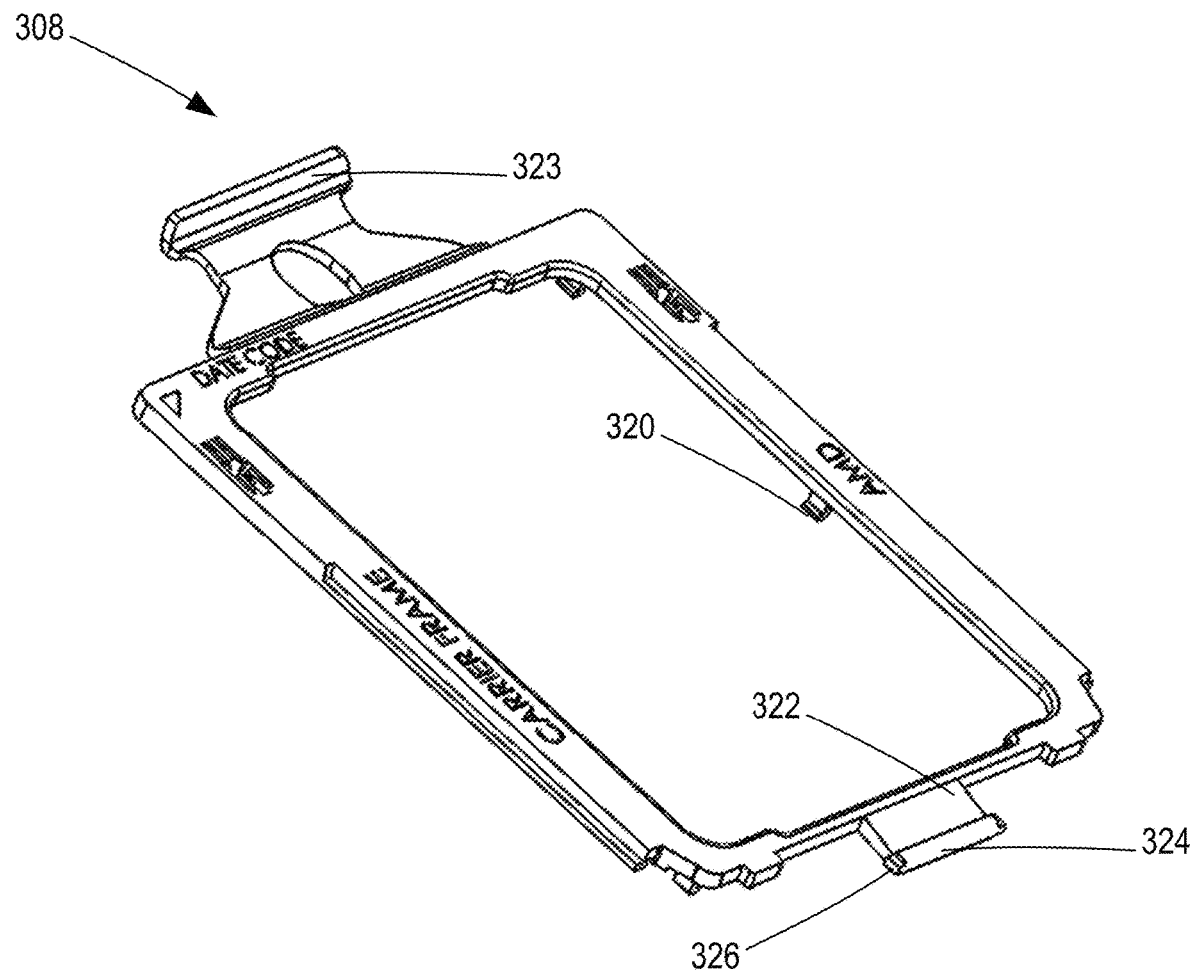
FIG. 3B is a diagram of an example carrier frame of a socket actuation mechanism for package insertion and package-socket alignment according to some implementations of the present disclosure.

The SAM 300 also includes a carrier frame 308. A detailed view of the carrier frame 308 is shown at FIG. 3B. The carrier frame 308 is a frame of rigid material such as metal or plastic that includes a center portion having one or more package interlocks 320. The package interlocks 320 include clips or other components that hold and fix a die package in place within the center portion of the carrier frame 308. The carrier frame 308 includes a tab 322 extending from one end of the carrier frame 308. In some implementations, the carrier frame 308 includes another tab 323 extending from an opposite end of the carrier frame 308 to facilitate manipulation and manual coupling of the carrier frame 308 to the socket frame 302.

Figure 3C:
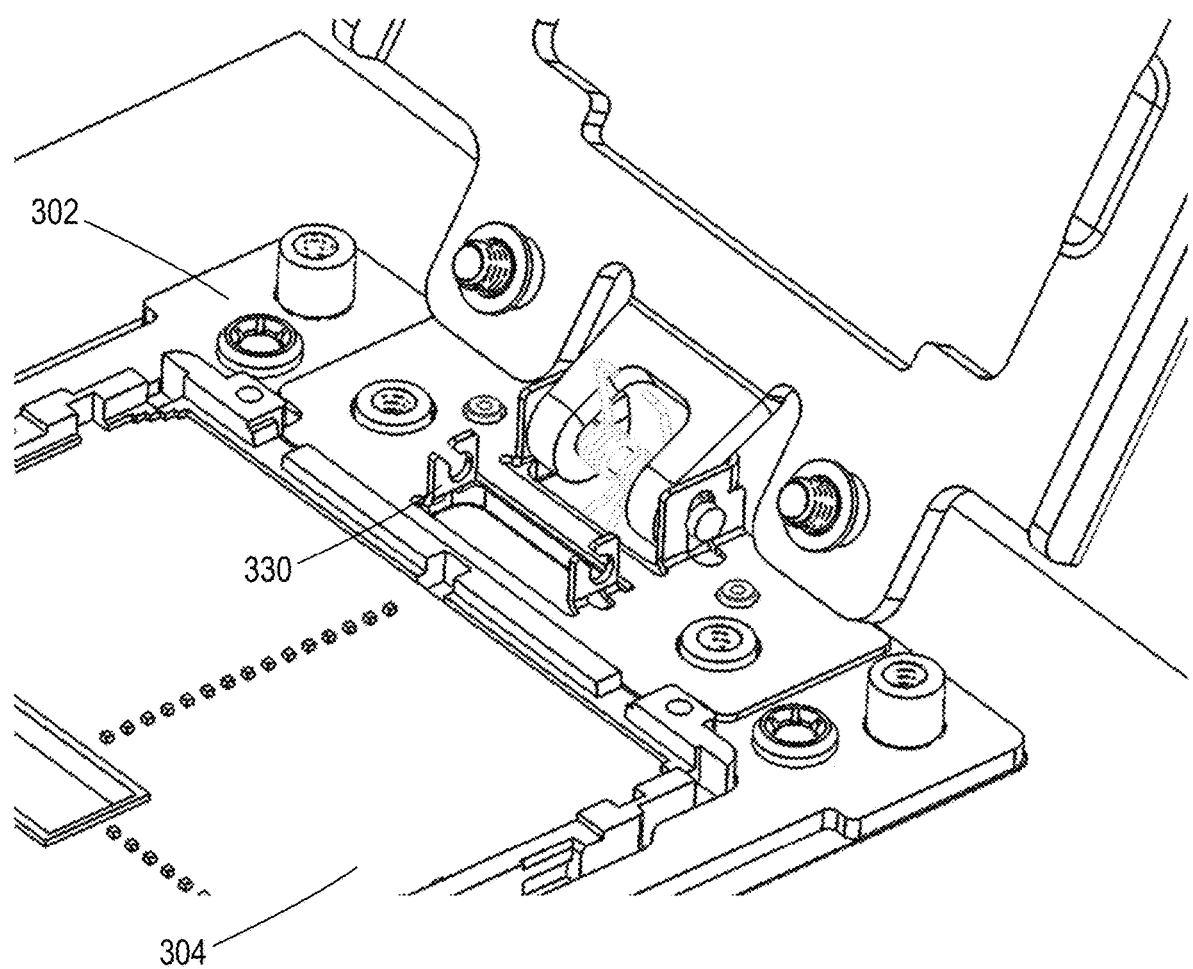
FIG. 3C is a view of an example socket frame and force frame assembly for a socket actuation mechanism for package insertion and package-socket alignment according to some implementations of the present disclosure.

The tab 322 includes a hinge portion 324. As shown in FIG. 3C, the socket frame 302 includes hinge portions 330. The carrier frame 308 is couplable to the socket frame 302 by coupling the hinge portion 324 of the carrier frame 308 to the hinge portions 330 of the socket frame 302. When coupled, the hinge portions 324, 330 form a hinge that allows the socket frame 302 to rotate on an axis defined by the hinge.

As seen in FIG. 3B, the hinge portion 324 of the tab 322 of the carrier frame 308 includes guide tabs 326 extending from the hinge portion 324 that guide the coupling of the carrier frame 308 to the socket frame 302. In some implementations, the guide tabs 326 are rectangular tabs. In other implementations, the guide tabs 326 include parallel flat sides and opposing rounded sides. One skilled in the art will appreciate that other configurations or shapes of guide tabs 326 are also contemplated within the scope of the present disclosure.

Figure 3D:
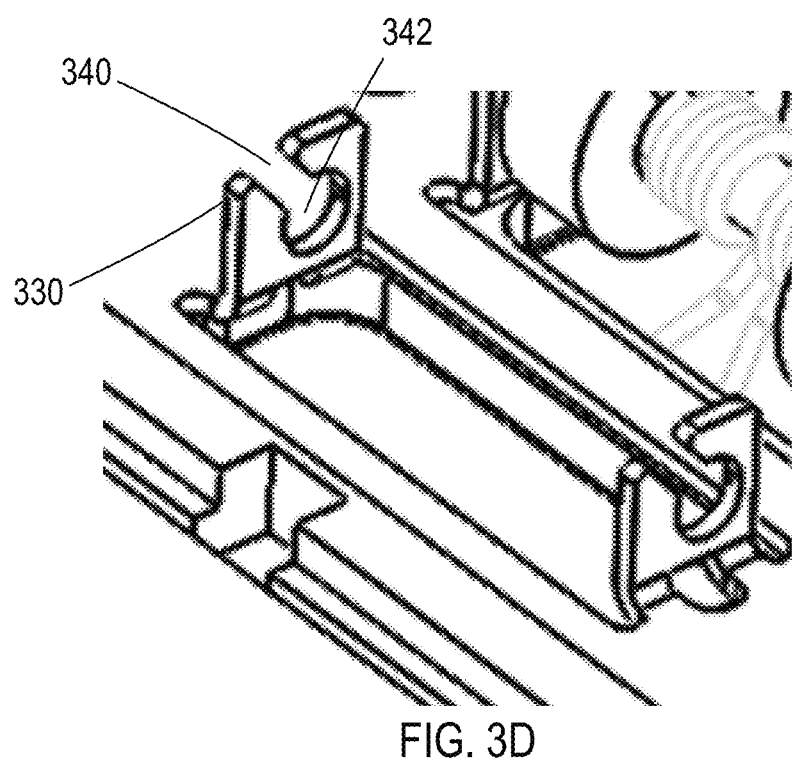
FIG. 3D is a view of an example hinge portion of a socket frame for a socket actuation mechanism for package insertion and package-socket alignment according to some implementations of the present disclosure.

FIG. 3D shows a zoomed-in view of the hinge portions 330 of the socket frame 302. Each hinge portion 330 includes a guide gap 340. The guide gap 340 is an open space in the hinge portion 330 into which the guide tabs 326 are inserted. The width of the guide gaps 340 are equal or substantially equal to a dimension of the guide tabs 326 (e.g., a width or distance between the parallel sides of the guide tabs 326). As shown, the guide gaps 340 extend from a rotational socket 342. Thus, the guide tabs 326 slide into the guide gaps 340 and into the rotational socket 342. The rotational socket 342 is a rounded opening in the hinge portion 330. In some implementations, a circumference of the rotational socket 342 is equal or substantially equal to another dimension of the guide tabs 326. For example, in some implementations, the circumference of the rotational socket 342 corresponds to a diagonal dimension of the guide tabs 326. Thus, the guide tabs 326 are able to rotate within the rotational socket 342. Due to the guide gap 340 having a lesser dimension than the rotational socket 342, the guide tabs 326 are able to rotate within the rotational socket 342 without falling out of or being displaced from the rotational socket 342 without alignment of the guide tabs 326 to the guide gaps 340. When the guide tabs 326 are inserted into the rotational sockets 342 of the hinge portions 330 of the socket frame 302, a hinge is formed allowing the carrier frame 308 to rotate on an axis defined by the hinge. Thus, the carrier frame 308 is capable of rotating towards the socket 302 via the formed hinge, thereby aligning a center portion of the carrier frame 308 (e.g., holding a die package) with a center portion of the socket frame (e.g., framing the socket 304).

Turning back to FIG. 3A, the SAM 300 also includes a force frame 310. The force frame 310 is a frame of rigid material such as metal or plastic that is coupled to the socket frame 302 via another hinge or interlocking mechanism (e.g., a spring loaded hinge). The force frame 310 is actuated by rotating towards the socket 304 such that a die package in the carrier frame 308 seated in the socket 304 receives force into the socket 304 from the force frame 310. For example, the force frame 310 provides an indirect force to a die package by applying a force to the carrier frame 308 in the direction of the socket 304. In some implementations, the force frame 310 is held or fixed in the actuated (e.g., rotated and closed) position by one or more screws. For example, the socket frame 302 includes screw holes 312 aligned with holes of an actuated force frame 310, thereby allowing screws to be inserted into the screw holes 312 and fix the force frame 310 in the actuated position.

One skilled in the art will appreciate that the SAM 300 provides space saving benefits over existing solutions for SAMs. For example, the SAM 300 does not require the use of a rail frame, reducing the horizontal and vertical space footprint used by the SAM 300. Moreover, the SAM 300 requires lesser materials compared to other SAM solutions.

Figure 4A:
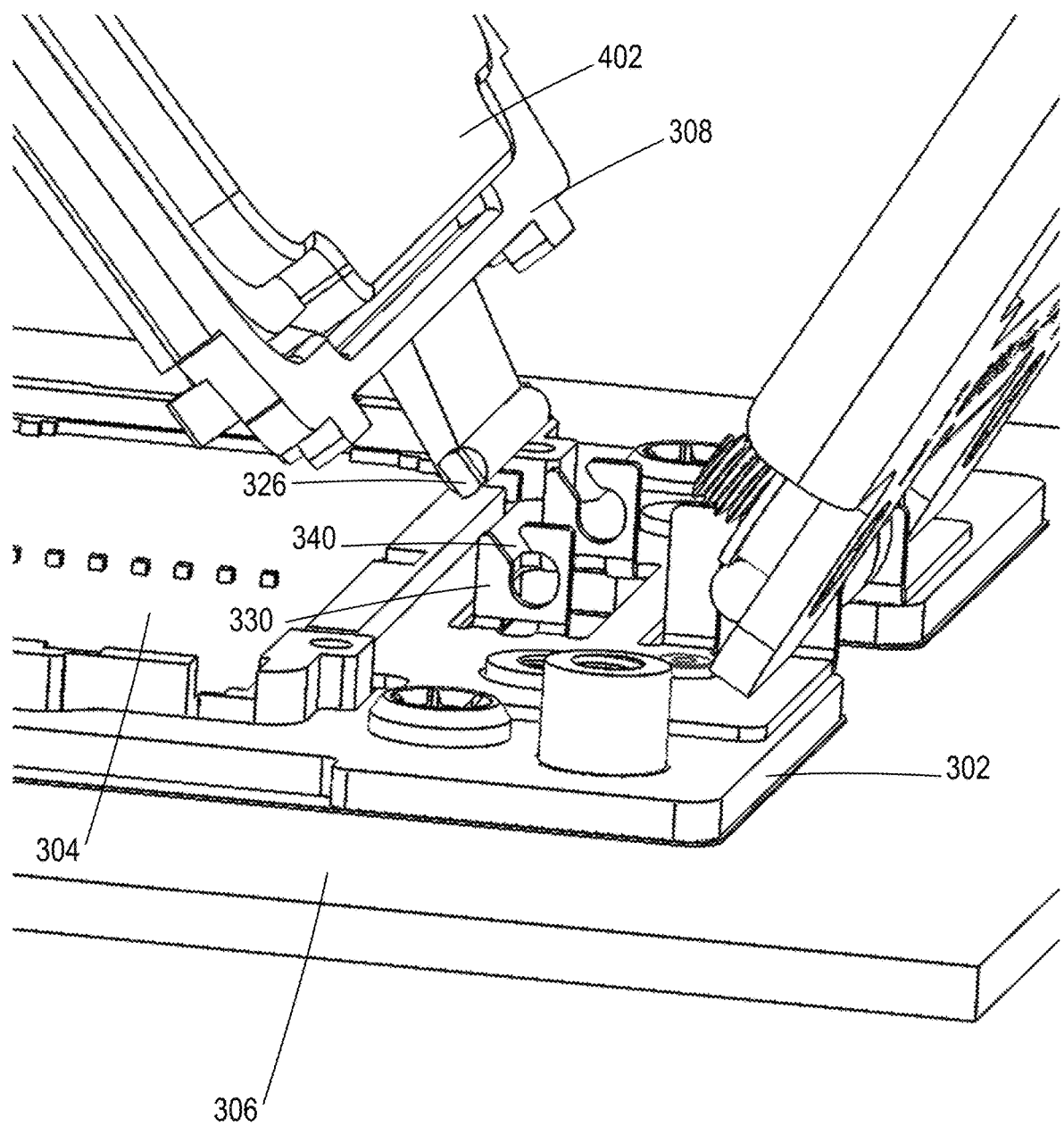
FIG. 4A is a portion of a process flow for seating a die package using a socket actuation mechanism for package insertion and package-socket alignment according to some implementations of the present disclosure.
Figure 4B:
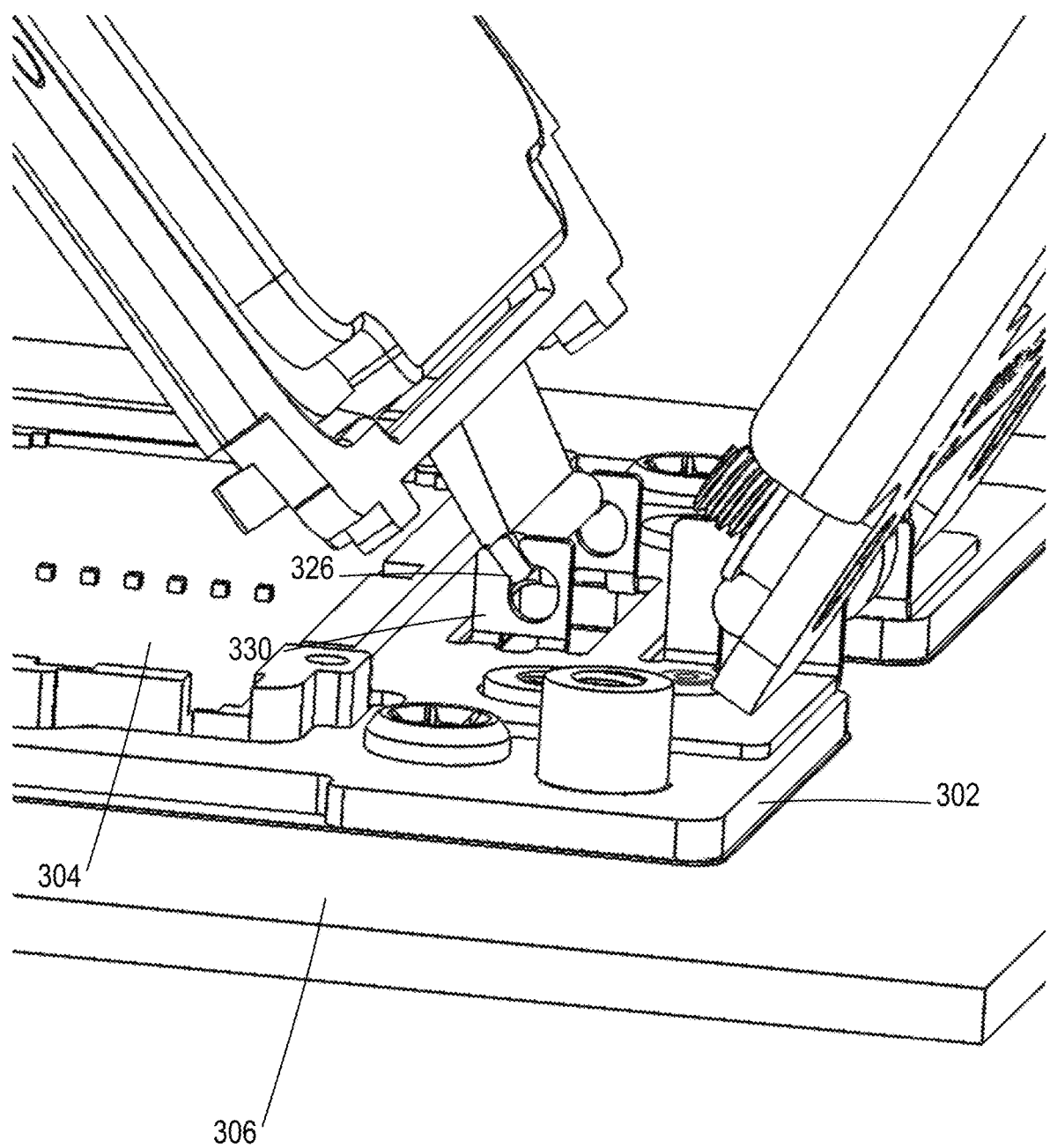
FIG. 4B is another portion of a process flow for seating a die package using a socket actuation mechanism for package insertion and package-socket alignment according to some implementations of the present disclosure.
Figure 4C:
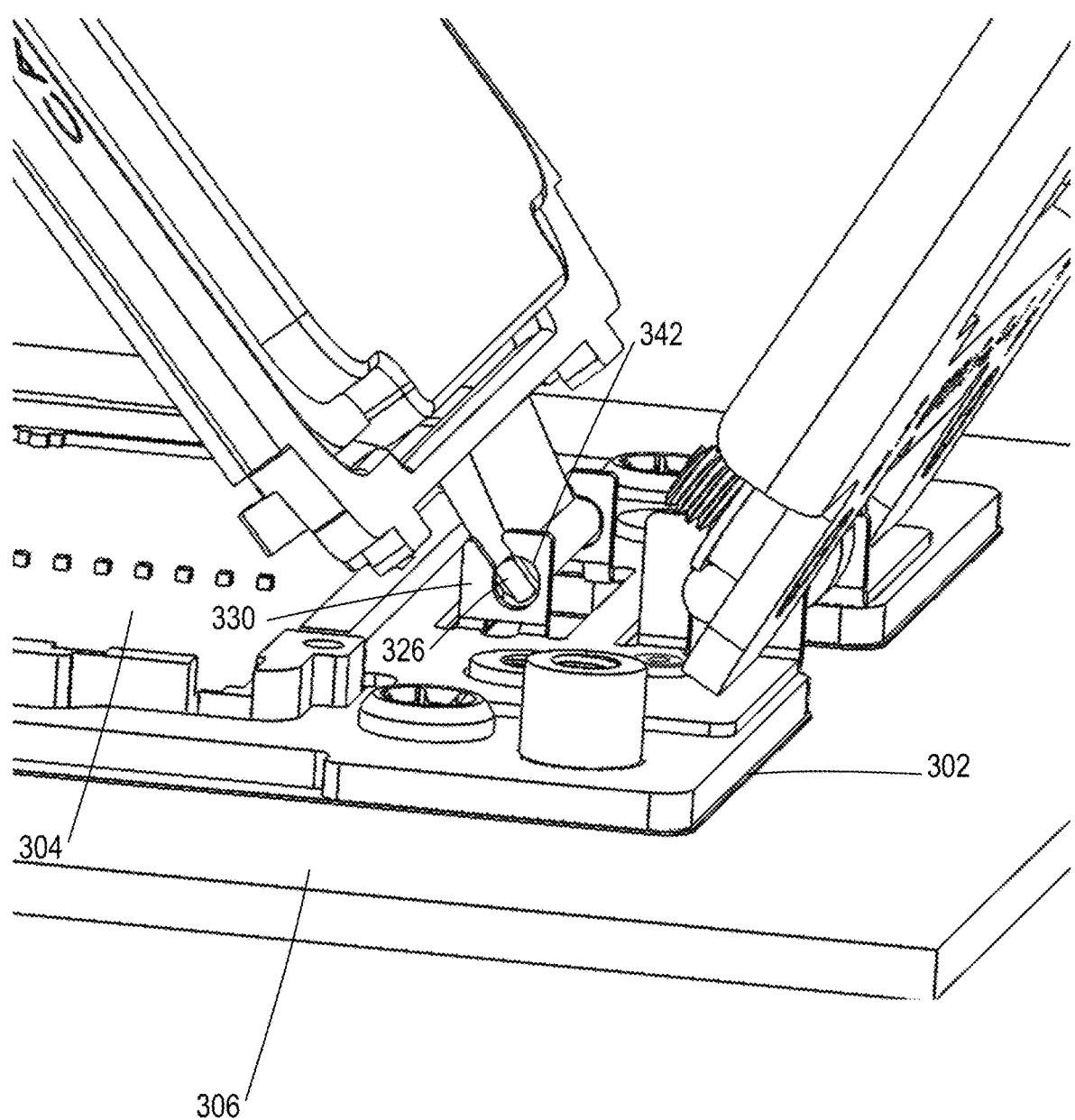
FIG. 4C is another portion of a process flow for seating a die package using a socket actuation mechanism for package insertion and package-socket alignment according to some implementations of the present disclosure.

FIGS. 4A-4F show a visual representation of seating a die package in a socket using an SAM 300 according to some implementations of the present disclosure. Beginning with FIG. 4A, a carrier frame 308 is holding (e.g., framing) a die package 402. The die package 402 includes, for example, a CPU die package 402 or another die package 402 as can be appreciated. The socket frame 302 is mounted to a substrate 306 such as a PCB and is framing a socket 304 (e.g., a LGA socket 304, a PGA socket 304, or other socket 304 as can be appreciated). The guide tabs 326 of the carrier frame 308 are aligned with the guide gaps 340 of the hinge portions 330 of the socket frame 302. As shown in FIG. 4B, the guide gaps 340 control the insertion of the guide tabs 326. At FIG. 4C, the guide tabs 326 have been inserted into the rotational sockets 342 via the guide gaps 340.

Figure 4D:
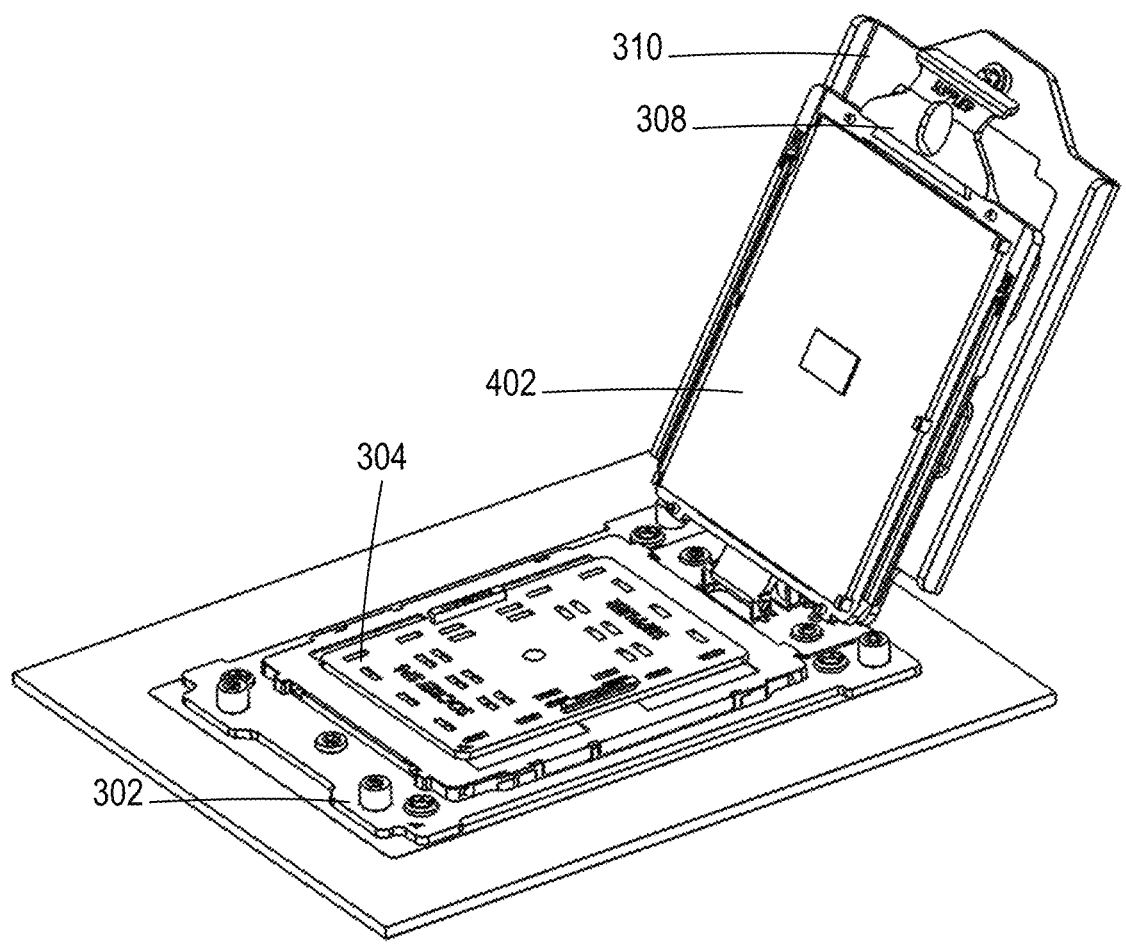
FIG. 4D is another portion of a process flow for seating a die package using a socket actuation mechanism for package insertion and package-socket alignment according to some implementations of the present disclosure.

As shown in FIG. 4D, the carrier frame 308 with the die package 402 and coupled to the socket frame 302 rests on the force frame 310 to allow the socket 304 to be exposed. For example, a lid or protective covering on the socket 304 is removed to expose the interconnects between the socket 304 and the die package 402.

Figure 4E:
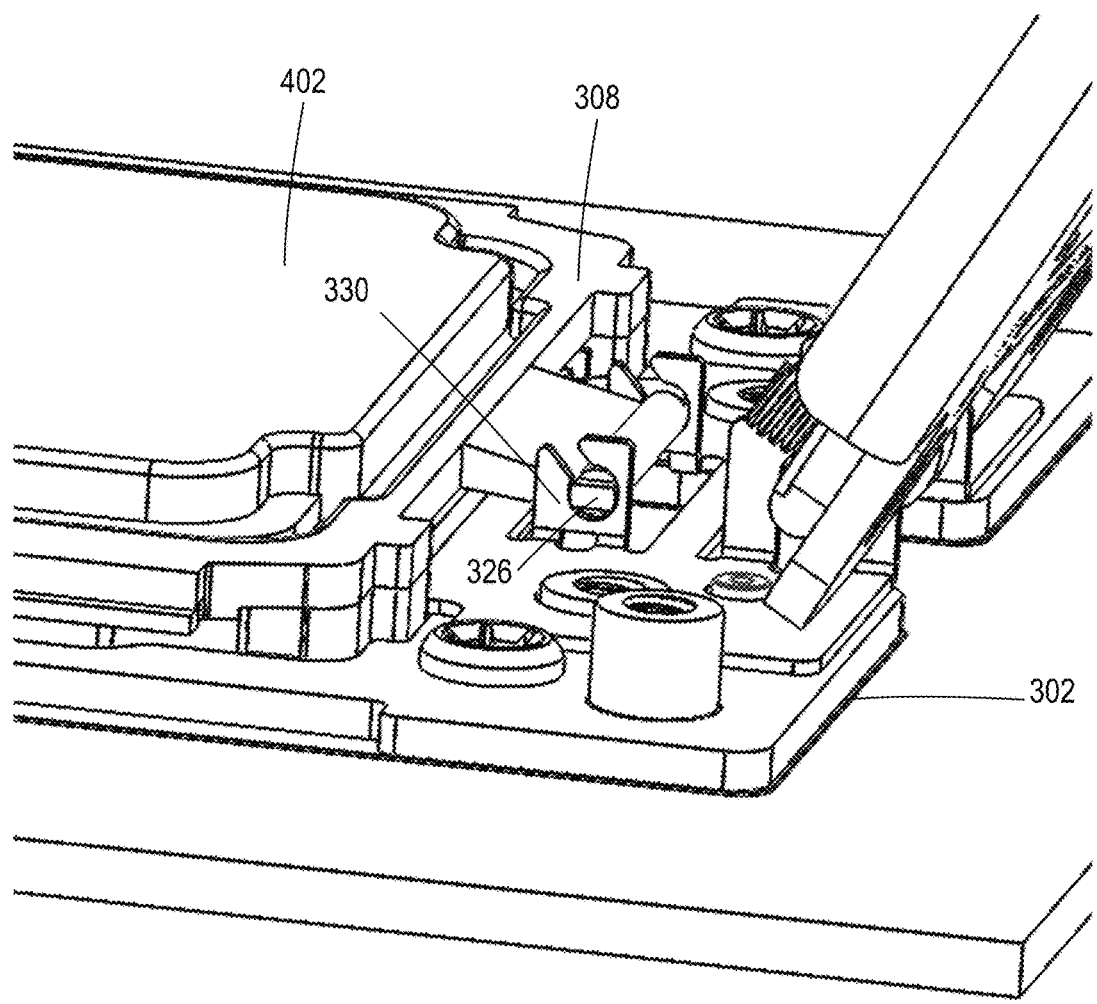
FIG. 4E is another portion of a process flow for seating a die package using a socket actuation mechanism for package insertion and package-socket alignment according to some implementations of the present disclosure.

At FIG. 4E, the carrier frame 308 is rotated via the hinge formed by hinge portions 324 and 330 towards the socket 304. The center portion of the carrier frame 308 holding the die package 402 is thereby aligned with the center portion of the socket frame 302 framing the socket 304.

Figure 4F:
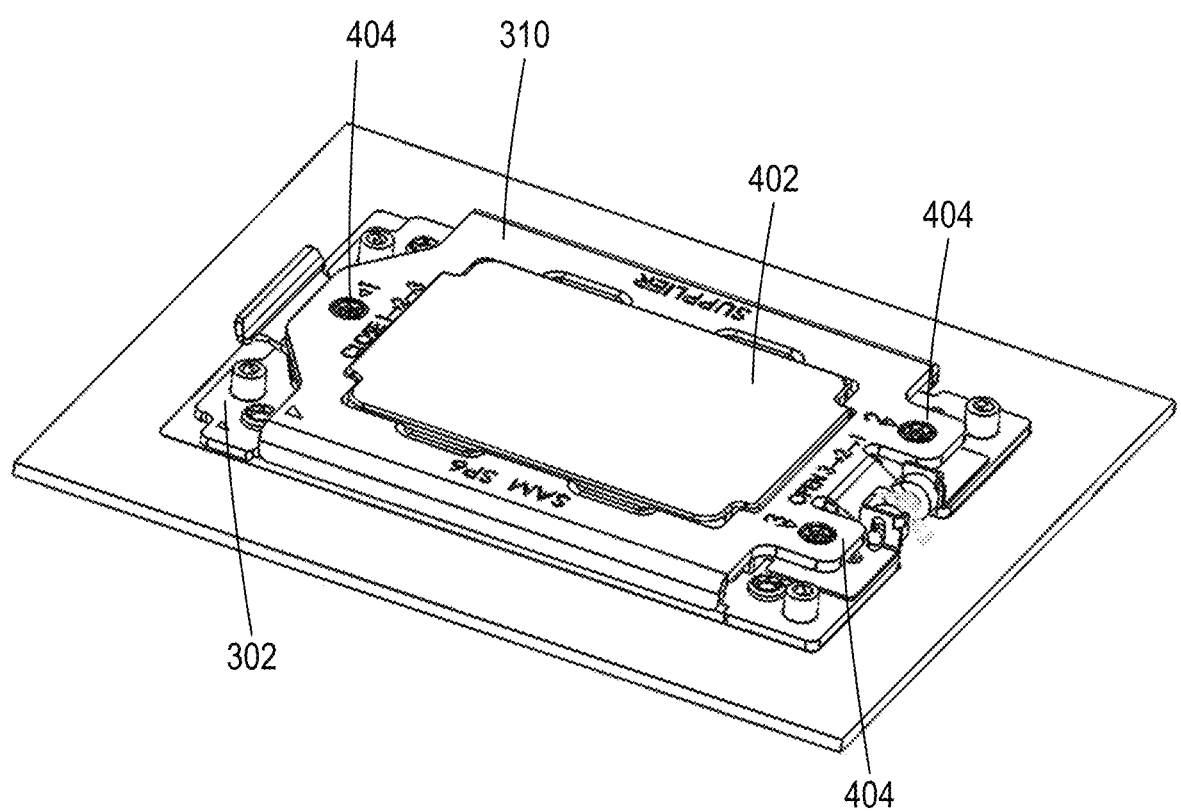
FIG. 4F is another portion of a process flow for seating a die package using a socket actuation mechanism for package insertion and package-socket alignment according to some implementations of the present disclosure.

At FIG. 4F the force frame 310 is actuated by rotating towards the socket 304. The force frame 310, once actuated, provides force to the carrier frame 308 and forces the die package 402 into the socket 304. The force frame 310 is fixed in the actuated position using screws 404.

Figure 5:
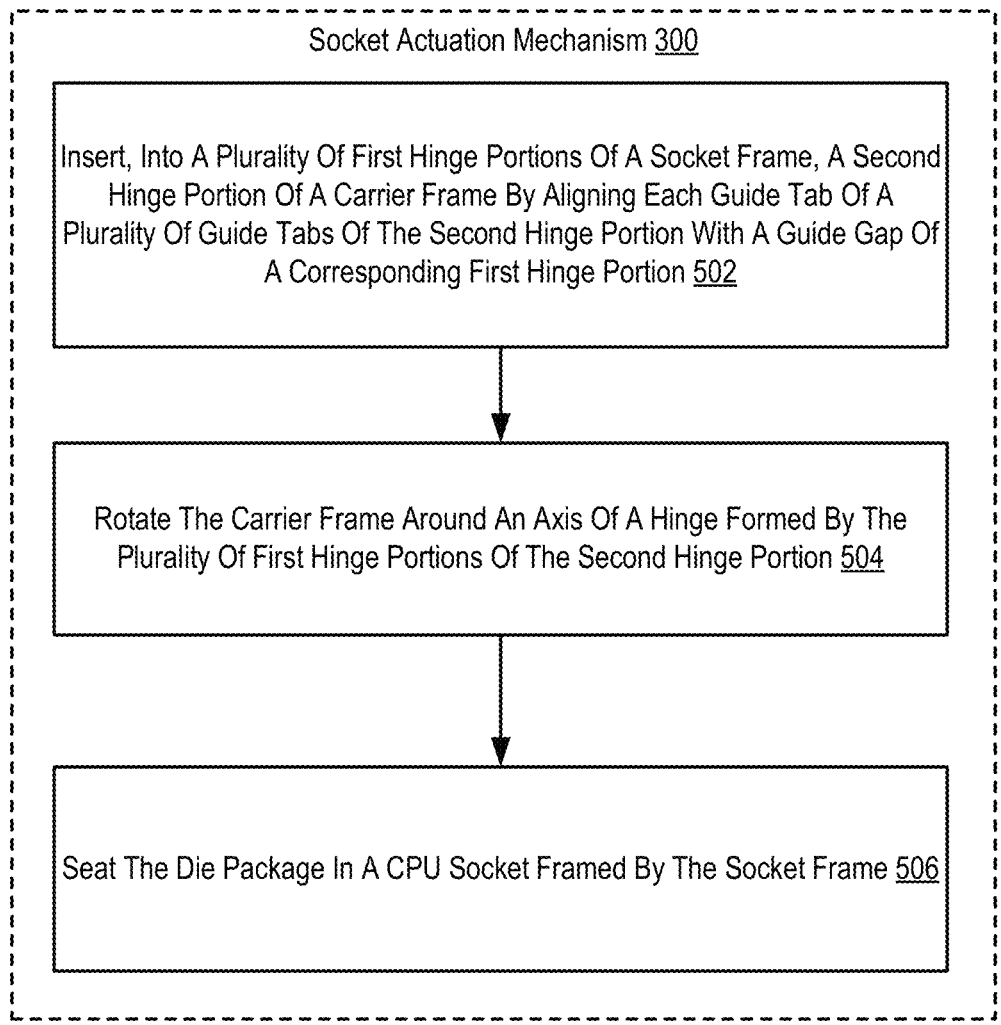
FIG. 5 is a flowchart of an example method for package insertion and package-socket alignment according to some implementations of the present disclosure.

For further explanation, FIG. 5 sets forth a flow chart illustrating an example method for package insertion and package-socket alignment according to implementations of the present disclosure. The method of FIG. 5 is performed using a socket actuation mechanism 300 like those of the previous figures. The method of FIG. 5 includes inserting 502, into a plurality of first hinge portions 330 of a socket frame 302, a second hinge portion 324 of a carrier frame 308. Such insertion 502 is carried out by aligning each guide tab 326 of a plurality of guide tabs 326 of the second hinge portion 324 with a guide gap 340 of a corresponding first hinge portion 330. The carrier frame 308 is a frame of rigid material such as metal or plastic that includes a center portion having one or more package interlocks 320. The package interlocks 320 include clips or other components that hold and fix in place a die package within the center portion of the carrier frame 308.

The second hinge portion 324 is part of a tab 322 that extends from one end of the carrier frame 308. The second hinge portion 324 includes guide tabs 326 that facilitate coupling of the second hinge portion 324 of the carrier frame 308 to the first hinge portions 330 of the socket frame 302. In some implementations, the guide tabs 326 are rectangular tabs. In other implementations, the guide tabs 326 include parallel flat sides and opposing rounded sides. One skilled in the art will appreciate that other configurations or shapes of guide tabs 326 are also contemplated within the scope of the present disclosure.

For example, the first hinge portions 330 include guide gaps 340 that are open spaces into which the guide tabs 326 are inserted. The width of the guide gaps 340 are equal or substantially equal to a dimension of the guide tabs 326 (e.g., a width or distance between the parallel sides of the guide tabs 326). the guide gaps 340 extend from a rotational socket 342. Thus, the guide tabs 326 slide into the guide gaps 340 and into the rotational socket 342. The rotational socket 342 is a rounded opening in the hinge portion 330. In some implementations, a circumference of the rotational socket 342 is equal or substantially equal to another dimension of the guide tabs 326. For example, in some implementations, the circumference of the rotational socket 342 corresponds to a diagonal dimension of the guide tabs 326. Thus, the guide tabs 326 are able to rotate within the rotational socket 342. Due to the guide gap 340 having a lesser dimension than the rotational socket 342, the guide tabs 326 are able to rotate within the rotational socket 342 without falling out of or being displaced from the rotational socket 342 without alignment of the guide tabs 326 to the guide gaps 340.

The method of FIG. 5 also includes rotating 504 the carrier frame 308 around an axis of a hinge formed by the plurality of first hinge portions 330 and the second hinge portion 324. When the guide tabs 326 are inserted into the rotational sockets 342 of the second hinge portions 330 of the socket frame 302, a hinge is formed allowing the carrier frame 308 to rotate on an axis defined by the hinge. Thus, the carrier frame 308 is capable of rotating towards the socket 302 via the formed hinge, thereby aligning a center portion of the carrier frame 308 (e.g., holding a die package) with a center portion of the socket frame (e.g., framing the socket 304).

The method of FIG. 5 also includes seating 506 the die package in a CPU socket 304 framed by the socket frame 302. By rotating the carrier frame 308 toward the socket 304, the die package in the carrier frame 308 will be seated in the socket 304 by virtue of the interconnects between the die package and the socket 304 being aligned by the SAM 300. Thus, the die package is seated (e.g., actuated) by coupling the interconnects between the die package and the socket 304.

Figure 6:
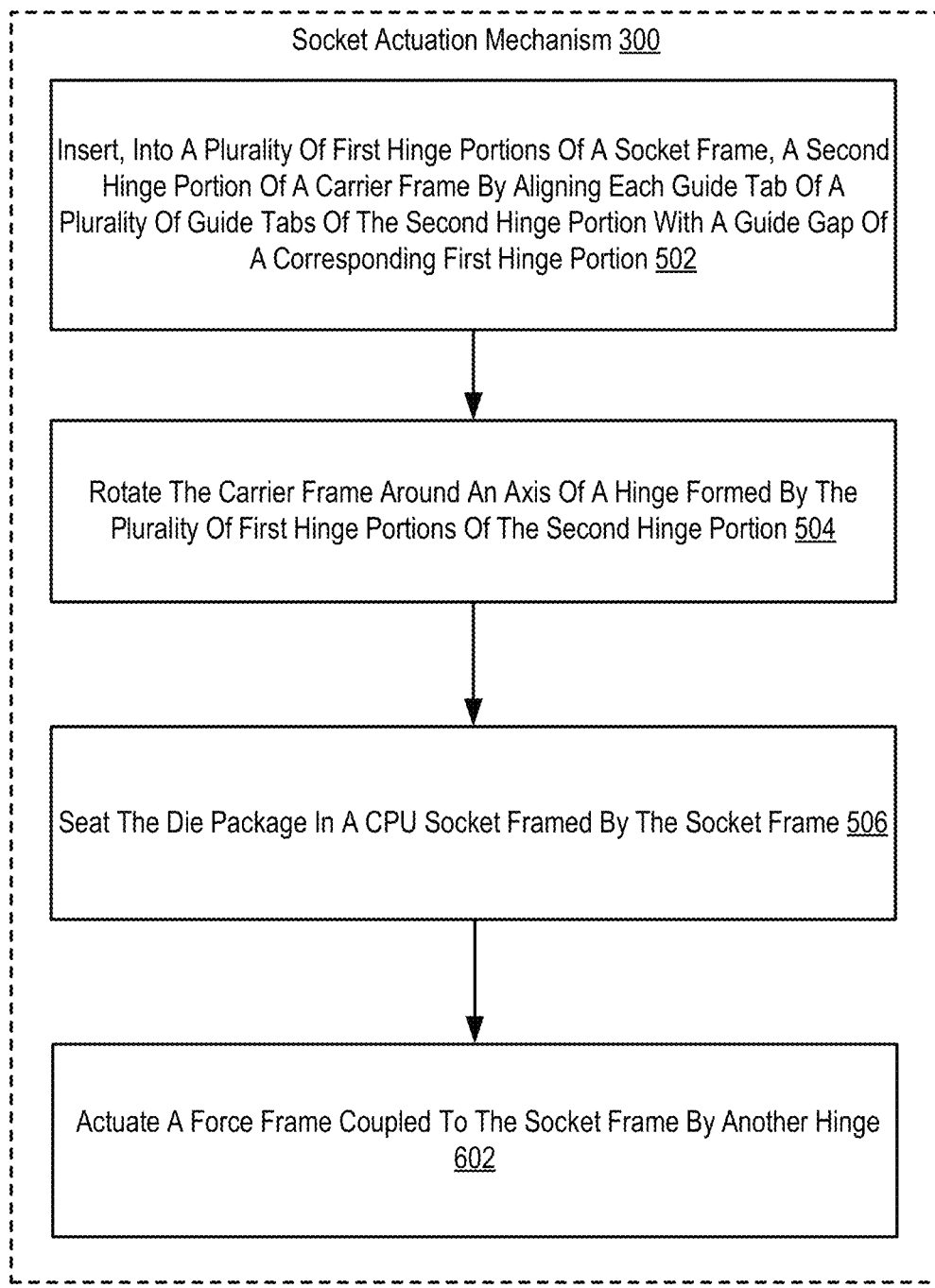
FIG. 6 is a flowchart of another example method for package insertion and package-socket alignment according to some implementations of the present disclosure.

For further explanation, FIG. 6 sets forth a flow chart illustrating another example method for package insertion and package-socket alignment according to implementations of the present disclosure. The method of FIG. 6 is similar to FIG. 5 except that the method of FIG. 6 also includes actuating 602 a force frame 310 coupled to the socket frame 302 by another hinge. The force frame 310 is a frame of rigid material such as metal or plastic that is coupled to the socket frame 302 via another hinge or interlocking mechanism (e.g., a spring loaded hinge). The force frame 310 is actuated by rotating towards the socket 304 such that a die package in the carrier frame 308 seated in the socket 304 receives force into the socket 304 from the force frame 310. For example, the force frame 310 provides an indirect force to a die package by applying a force to the carrier frame 308 in the direction of the socket 304.

Figure 7:
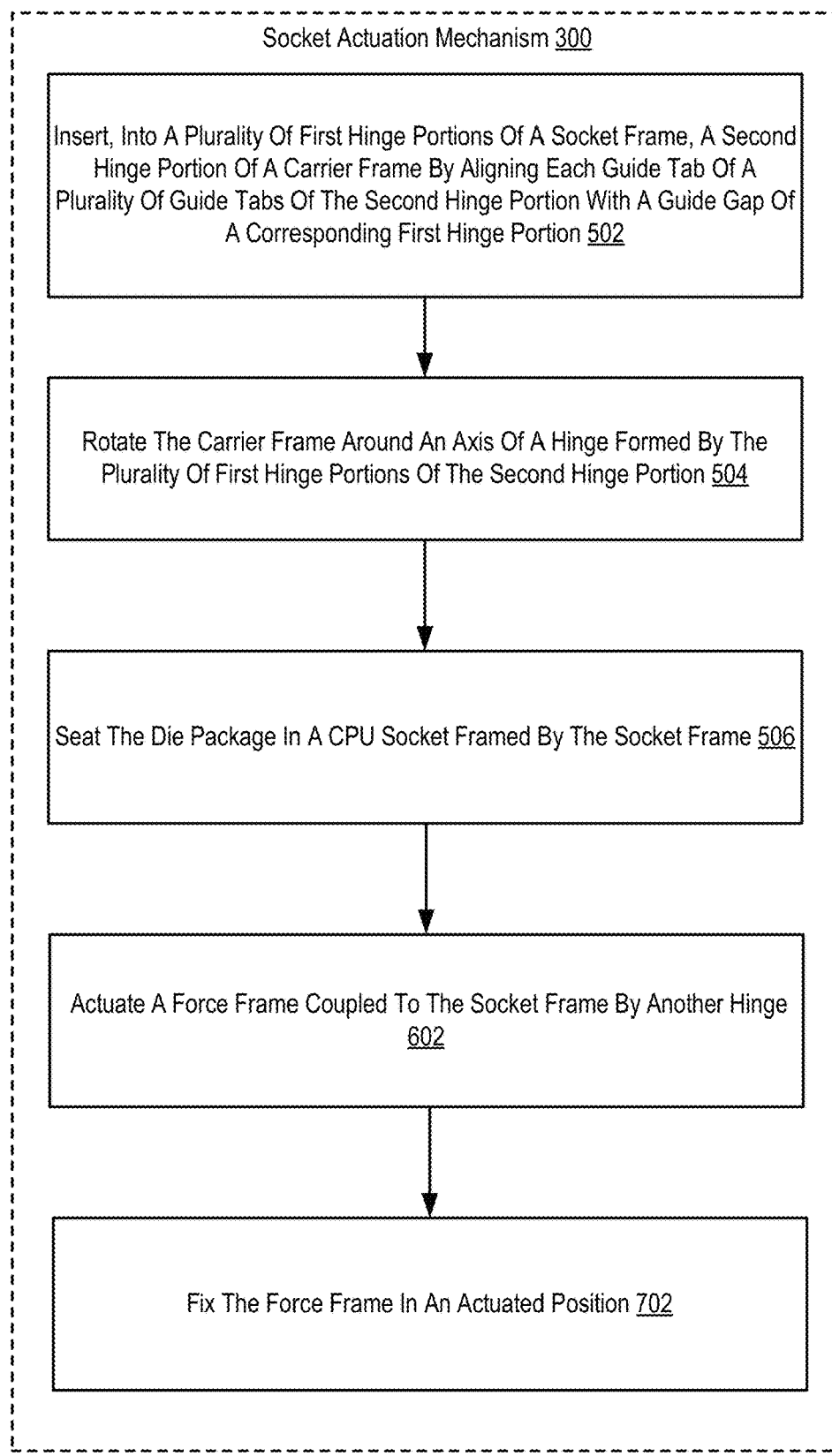
FIG. 7 is a flowchart of another example method for package insertion and package-socket alignment according to some implementations of the present disclosure.

For further explanation, FIG. 7 sets forth a flow chart illustrating another example method for package insertion and package-socket alignment according to implementations of the present disclosure. The method of FIG. 7 is a variation of FIG. 6 in that the method of FIG. 7 also includes fixing 702 the force frame 310 in an actuated position. In some implementations, the force frame 310 is held or fixed in the actuated (e.g., closed) position by one or more screws. For example, the socket frame 302 includes screw holes 312 aligned with holes of an actuated force frame 310, thereby allowing screws to be inserted into the screw holes 312 and fix the force frame 310 in the actuated position. Thus, the die package is seated in the socket 304 and held securely in place by the force frame 310.

In view of the explanations set forth above, readers will recognize various benefits of a socket actuation mechanism for package insertion and package-socket alignment configured as described above. One such benefit includes improved performance of a computing system by providing a socket actuation mechanism for package insertion and package-socket alignment that requires less materials and a smaller horizontal and vertical space footprint compared to existing solutions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A socket actuation mechanism for package insertion and package-socket alignment, comprising:
   a socket frame comprising a plurality of first hinge portions, wherein each first hinge portion comprises a rotational socket having a rounded opening and a guide gap within the first hinge portion extending from the rounded opening in the rotational socket;
   a carrier frame comprising:
      a center portion comprising one or more package interlocks; and
      a tab extending from a first end of the carrier frame, the tab comprising a second hinge portion couplable with the plurality of first hinge portions to form a hinge coupling the carrier frame to the socket frame.

2. The socket actuation mechanism of claim 1, wherein the carrier frame, when coupled to the socket frame via the hinge, is rotatable to align the center portion of the carrier frame with another center portion of the socket frame.

3. The socket actuation mechanism of claim 1, wherein the guide gap has a width less than a circumference of the rotational socket.

4. The socket actuation mechanism of claim 3, wherein the second hinge portion comprises a plurality of guide tabs each having a first dimension substantially similar to the circumference of the rotational socket and a second dimension substantially similar to the width of the guide gap.

5. The socket actuation mechanism of claim 1, further comprising a force frame coupled to the socket frame by another hinge.

6. The socket actuation mechanism of claim 5, wherein the other hinge comprises a spring-loaded hinge.

7. The socket actuation mechanism of claim 5, wherein the socket frame further comprises one or more screw holes and the force frame comprises one or more holes aligned with the one or more screw holes when the force frame is actuated.

8. The socket actuation mechanism of claim 1, wherein the carrier frame further comprises another tab extending from a second end of the carrier frame.

9. An apparatus for package insertion and package-socket alignment, comprising:
   a substrate comprising a central processing unit (CPU) socket;
   a socket actuation mechanism comprising:
      a socket frame framing the CPU socket, the socket frame comprising a plurality of first hinge portions, wherein each first hinge portion comprises a rotational socket having a rounded opening and a guide gap within the first hinge portion extending from the rounded opening in the rotational socket;
      a carrier frame comprising a tab extending from a first end of the carrier frame, the tab comprising a second hinge portion coupled to the plurality of first hinge portions to form a hinge; and
      a die package coupled to the carrier frame and seated in the CPU socket.

10. The apparatus of claim 9, wherein the die package is framed by the socket frame within a center portion of the socket frame.

11. The apparatus of claim 9, wherein the guide gap has a width less than a circumference of the rotational socket.

12. The apparatus of claim 11, wherein the second hinge portion comprises a plurality of guide tabs each having a first dimension substantially similar to the circumference of the rotational socket and a second dimension substantially similar to the width of the guide gap.

13. The apparatus of claim 9, wherein the socket actuation mechanism further comprises a force frame coupled to the socket frame by another hinge.

14. The apparatus of claim 13, wherein the force frame is fixed in an actuated position by one or more screws.

15. The apparatus of claim 9, wherein the carrier frame further comprises another tab extending from a second end of the carrier frame.

16. A method for package insertion and package-socket alignment, comprising:
   inserting, into a plurality of first hinge portions of a socket frame, a second hinge portion of a carrier frame by aligning each guide tab of a plurality of guide tabs of the second hinge portion with a guide gap of a corresponding first hinge portion, wherein the carrier frame is coupled to a die package framed in a center portion of the carrier frame, wherein each first hinge portion comprises a rotational socket having a rounded opening and a guide gap within the first hinge portion extending from the rounded opening in the rotational socket;
   rotating the carrier frame around an axis of a hinge formed by the plurality of first hinge portions of the second hinge portions; and
   seating the die package in a CPU socket framed by the socket frame.

17. The method of claim 16, further comprising actuating a force frame coupled to the socket frame by another hinge.

18. The method of claim 17, further comprising fixing the force frame in an actuated position.

19. The method of claim 17, wherein the force frame, when actuated, applies a force to the die package into the CPU socket.

20. The method of claim 17, wherein a dimension of each guide tab is substantially similar to a width of the guide gap.

* * * * *